(12) United States Patent
Kido et al.

(10) Patent No.: US 8,677,582 B2
(45) Date of Patent: Mar. 25, 2014

(54) METHOD FOR FABRICATING ACOUSTIC WAVE DEVICE

(75) Inventors: Shunsuke Kido, Kusatsu (JP); Takeshi Nakao, Omihachiman (JP); Yasuharu Nakai, Takatsuki (JP); Kenji Nishiyama, Yasu (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 583 days.

(21) Appl. No.: 12/706,051

(22) Filed: Feb. 16, 2010

(65) Prior Publication Data

US 2010/0146754 A1    Jun. 17, 2010

Related U.S. Application Data

(60) Division of application No. 12/191,451, filed on Aug. 14, 2008, now Pat. No. 7,701,113, which is a continuation of application No. PCT/JP2007/051995, filed on Feb. 6, 2007.

(30) Foreign Application Priority Data

Mar. 2, 2006    (JP) .................. 2006-056378

(51) Int. Cl.
   *H03H 3/04*    (2006.01)
(52) U.S. Cl.
   USPC .............. 29/25.35; 29/594; 29/846; 29/852; 427/97.7; 427/98.4; 427/272; 427/282
(58) Field of Classification Search
   USPC .............. 29/25.35, 846, 852, 594; 427/97.7, 427/97.8, 98.4, 98.5, 272, 282; 310/313 R, 310/340, 346; 333/193
   See application file for complete search history.

(56) References Cited

U.S. PATENT DOCUMENTS

| | | | |
|---|---|---|---|
| 3,965,444 A | | 6/1976 | Willingham et al. |
| 4,243,960 A | * | 1/1981 | White et al. ............. 29/25.35 X |

(Continued)

FOREIGN PATENT DOCUMENTS

| | | |
|---|---|---|
| EP | 0 744 830 A1 | 11/1996 |
| EP | 1 467 484 A2 | 10/2004 |

(Continued)

OTHER PUBLICATIONS

Official Communication issued in corresponding Japanese Patent Application No. 2008-502681, mailed on Dec. 7, 2010.

(Continued)

*Primary Examiner* — A. Dexter Tugbang
(74) *Attorney, Agent, or Firm* — Keating & Bennett, LLP

(57) ABSTRACT

A method for fabricating an acoustic wave device includes the steps of forming an insulating material layer on a piezoelectric substrate, forming a patterned photoresist on the insulating material layer, patterning the insulating material layer, and forming a piezoelectric-substrate exposed depression corresponding to a region where an interdigital transducer electrode is to be formed on a first insulator layer composed of the insulating material layer, depositing a metallic material on the piezoelectric substrate to form the interdigital transducer electrode in the piezoelectric-substrate exposed depression such that the overall interdigital transducer electrode is thinner than the first insulator layer and coating the photoresist with a metallic material, removing the photoresist and the metallic material on the photoresist, and depositing a second insulator layer so as to cover the interdigital transducer electrode and the first insulator layer.

5 Claims, 10 Drawing Sheets

(56) References Cited

U.S. PATENT DOCUMENTS

| | | | |
|---|---|---|---|
| 5,923,231 A | 7/1999 | Ohkubo et al. | |
| 6,046,656 A * | 4/2000 | Mishima | 29/25.35 X |
| 7,339,304 B2 * | 3/2008 | Kadota et al. | 310/310 R X |
| 2006/0158800 A1 | 7/2006 | Takayama et al. | |
| 2006/0175928 A1 | 8/2006 | Kando | |
| 2007/0096592 A1 | 5/2007 | Kadota et al. | |
| 2007/0241840 A1 | 10/2007 | Takayama et al. | |

FOREIGN PATENT DOCUMENTS

| | | | |
|---|---|---|---|
| JP | 02104010 A * | 4/1990 | 29/25.35 |
| JP | 06-164293 A | 6/1994 | |
| JP | 08-222981 A | 8/1996 | |
| JP | 2001-111377 A | 4/2001 | |
| JP | 2004-207996 A | 7/2004 | |
| JP | 2004-222267 A | 8/2004 | |
| WO | 96/04713 A1 | 2/1996 | |
| WO | 2004/095699 A1 | 11/2004 | |
| WO | 2005/034347 A1 | 4/2005 | |
| WO | 2006/003933 A1 | 1/2006 | |

OTHER PUBLICATIONS

Kido et al., "Acoustic Wave Device and Method for Fabricating the Same", U.S. Appl. No. 12/781,050, filed May 17, 2010.
Kido et al.; "Acoustic Wave Device and Method for Fabricating the Same"; U.S. Appl. No. 12/191,451, filed Aug. 14, 2008.
Official Communication issued in corresponding Japanese Patent Application No. 2008-502681, mailed on Mar. 29, 2011.
Official Communication issued in corresponding Chinese Patent Application No. 200780007466.2, issued on Apr. 23, 2010.
Official Communication issued in corresponding European Patent Application No. 07713837.8, issued on Mar. 2, 2010.
Official Communication issued in corresponding European Patent Application No. 07713837.8, mailed on Jul. 19, 2013.

* cited by examiner

HEIGHT x OF PROJECTION OF INSULATOR LAYER (h/λ)

HEIGHT x OF PROJECTION OF INSULATOR LAYER (h/λ)

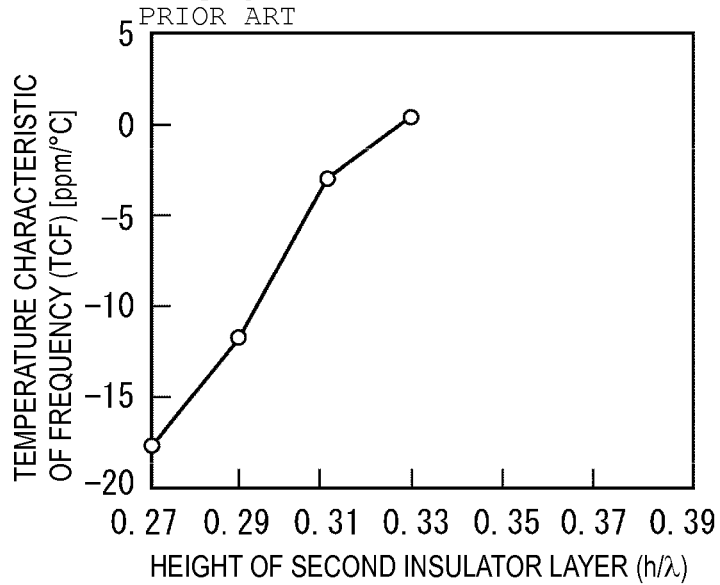
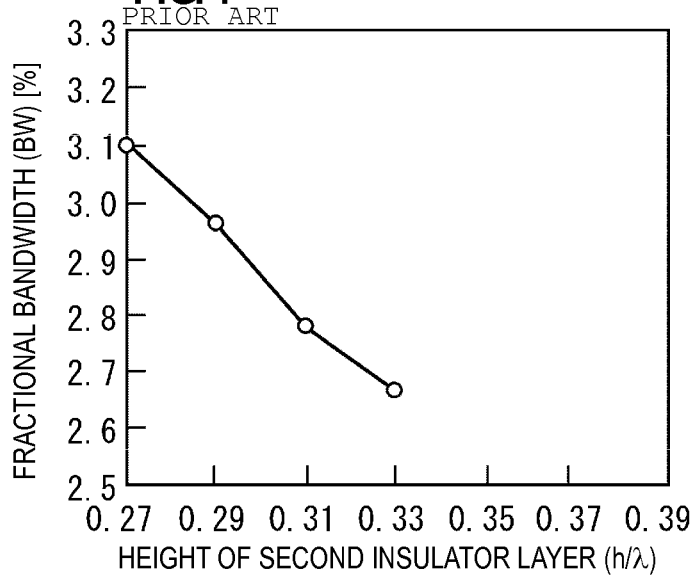

METHOD FOR FABRICATING ACOUSTIC WAVE DEVICE

BACKGROUND OF THE INVENTION

1. Field of the Invention

The present invention relates to an acoustic wave device used as, for example, a resonator or a band-pass filter, and more specifically, to an acoustic wave device that includes an insulator layer for improving temperature characteristics that is arranged so as to cover an interdigital (IDT) electrode and a method for fabricating the same.

2. Description of the Related Art

An acoustic wave resonator and an acoustic wave filter are widely used in a band-pass filter in a mobile communications device. One example of an acoustic wave device of this kind is disclosed in Japanese Unexamined Patent Application Publication No. 2004-112748. FIG. 13 is a front sectional view that schematically illustrates a surface acoustic wave device described in Japanese Unexamined Patent Application Publication No. 2004-112748. In a surface acoustic wave device 101 illustrated in FIG. 13, an IDT electrode 103 is provided on a piezoelectric substrate 102. An insulator layer 104 is provided so as to cover the IDT electrode 103. Here, the piezoelectric substrate 102 is made of a piezoelectric material that has a negative temperature coefficient of frequency, such as a lithium tantalate ($LiTaO_3$) substrate or a lithium niobate ($LiNbO_3$) substrate. On the other hand, the insulator layer 104 is made of an insulating material that has a positive temperature coefficient of frequency, such as silicon dioxide ($SiO_2$). Consequently, the surface acoustic wave device 101 having favorable temperature characteristics is provided.

In the surface acoustic wave device 101, the insulator layer 104 made of, for example, a $SiO_2$ film, is formed after the IDT electrode 103 is formed. Therefore, when the insulator layer 104 is formed by a thin-film forming method, such as vapor deposition, a projection 104a and a depression 104b, are inevitably formed. This is because the IDT electrode 103 is present under the insulator layer 104 and thus the surface of the insulator layer 104 is raised at a region where the IDT electrode 103 is present, which results in the projection 104a.

However, when the projection and depression are formed, an unwanted ripple appears in the frequency characteristics. An acoustic wave device that does not include any projections and depressions is disclosed in WO 2005/034347 A1. The structure of the acoustic wave device described in WO 2005/034347 A1 is illustrated in FIG. 14 with a schematic front sectional view. In an acoustic wave device 111, an IDT electrode 113 is provided on a piezoelectric substrate 112. A first insulation layer 114 having the same film thickness as the IDT electrode 113 is formed around a region where the IDT electrode 113 is present. A second insulator layer 115 is formed so as to cover the IDT electrode 113 and the first insulator layer 114. Here, after the first insulator layer 114 and the IDT electrode 113 is formed, the second insulator layer 115 is formed. As a result, the second insulator layer 115 has a surface 115a having no projections or depressions, so the second insulator layer 115 is substantially flat.

Because the insulator layer 104 in the surface acoustic wave device 101 described in Japanese Unexamined Patent Application Publication No. 2004-112748 has a sufficient thickness over a region where the IDT electrode 103 is present, the insertion loss tends to deteriorate. In addition, when the thickness of the insulator layer 104 is increased in order to improve temperature characteristics, a problem exists in which the fractional bandwidth is reduced.

If, in the acoustic wave device 114 described in WO 2005/034347 A1, the second insulator layer 115 formed on a region where the IDT electrode 113 is present has a reduced thickness to improve the temperature characteristics, it is difficult to improve the temperature characteristics using the second insulator layer 115. On the other hand, if the second insulator layer 115 has a sufficiently increased thickness to improve the temperature characteristics, the thickness of the second insulator layer 115 over the IDT electrode 113 is increased, so a problem in which the fractional bandwidth is reduced exists.

That is, in the surface acoustic wave device 101 or 111 described in Japanese Unexamined Patent Application Publication No. 2004-112748 and WO 2005/034347 A1, there is a problem in which the insertion loss is increased or the fractional bandwidth is reduced when the thickness of the insulator layer over the IDT electrode is sufficiently increased to improve the temperature characteristics. If the thickness of the insulator layer 104 or 115 over the IDT electrode 103 is reduced to avoid this problem, the temperature characteristics cannot be sufficiently improved.

SUMMARY OF THE INVENTION

To overcome the problems described above, preferred embodiments of the present invention provide an acoustic wave device in which temperature characteristics are improved while the fractional bandwidth is less susceptible to being reduced without causing an increase in the insertion loss in a structure in which an insulation layer to improve the temperature characteristics is provided on an IDT electrode.

According to a first preferred embodiment of the present invention, an acoustic wave device includes a piezoelectric substrate that includes a first main surface and a second main surface, at least one IDT electrode provided on the first main surface of the piezoelectric substrate, and an insulator layer provided to improve a temperature characteristic arranged on the piezoelectric substrate so as to cover the IDT electrode. Where the wavelength of an acoustic wave is $\lambda$, when a surface of the insulator layer is classified into a first surface region under which the IDT electrode is located and a second surface region under which no IDT electrode is located, the height of the surface of the insulator layer in at least one portion of the second surface region is greater than the height of the surface of the insulator layer from the piezoelectric substrate in at least one portion of the first surface region by at least about $0.001\lambda$. Specifically, the height of the surface of the insulator layer in at least one portion of the second surface region is greater than the height of the surface of the insulator layer in the first surface region by at least about $0.001\lambda$, and the height of the surface of the insulator layer in the second surface region is greater than the height of the insulator layer in at least one portion of the first surface region by at least about $0.001\lambda$.

According to a second preferred embodiment of the present invention, an acoustic wave device includes a piezoelectric substrate that includes a first main surface and a second main surface, at least one IDT electrode provided on the first main surface of the piezoelectric substrate, and an insulator layer to improve a temperature characteristic arranged on the piezoelectric substrate so as to cover the IDT electrode. The insulator layer includes a surface that has a projection protruding upward in at least one portion of a region under which no IDT electrode is located, and the height of the projection from the surface of the insulator layer disposed around the projection is at least about $0.001\lambda$ ($\lambda$ is the wavelength of an acoustic wave).

That is, in the first and second preferred embodiments of the present invention, the insulator layer for improving the temperature characteristic is arranged so as to cover the IDT electrode, and the surface of the insulator layer in the first surface region, under which the IDT electrode is located and that in the second surface region, under which no electrode is located, have different heights. In the first preferred embodiment, the height of the surface of the insulator layer in at least one portion of the second surface region is greater than the height of the surface of the insulator layer from the piezoelectric substrate in at least one portion of the first surface region by at least about $0.001\lambda$. In the description of the second preferred embodiment, the upwardly protruding projection is disposed in at least one portion of the region under which no IDT electrode is located, i.e., of the second surface region in the first preferred embodiment, and the height of the projection from the surface of the insulator layer disposed around the projection is at least about $0.001\lambda$.

According to a preferred embodiment of the present invention, the insulator layer over the IDT electrode has a thinner portion. Therefore, the insertion loss is less prone to being degraded and the fractional bandwidth is less prone to being narrowed, while at the same time sufficient advantageous effects of improving the temperature characteristic are obtained from the other thicker portion of the insulator layer.

The structure of the insulator layer for improving the temperature characteristic is not particularly limited. According to a specific preferred embodiment of the present invention, the insulator layer may include a first insulator layer and a second insulator layer, the first insulator layer being disposed around the IDT electrode and having a film thickness greater than that of the IDT electrode, the second insulator layer being disposed so as to cover the first insulator layer and the IDT electrode and having the same film thickness. In this case, the acoustic wave device can be easily provided merely by the formation of the second insulator layer having the same film thickness after the formation of the IDT electrode and the first insulator.

Preferably, the first and second insulator layers may be made of the same insulator material. In this case, because the first insulator layer and the second insulator layer can be made of the same material, the process can be simplified and the cost of manufacturing can be reduced. Alternatively, the first and second insulator layers may be made of different insulator materials.

Preferably, the piezoelectric substrate may be made of a piezoelectric material having a negative temperature coefficient of frequency, and the insulator layer for improving the temperature characteristic may be made using silicon oxide. In this case, the insulator layer made of silicon oxide and having a positive temperature coefficient of frequency sufficiently reduces changes in the frequency characteristic due to temperature.

Preferably, the IDT electrode may have a duty ratio of between about 0.25 and about 0.60. This range of the duty ratio prevents an increase in electric resistance of the IDT electrode, and according to preferred embodiments of the present invention, the temperature characteristic can be improved while the degradation of the insertion loss and the narrowing of the fractional bandwidth are prevented.

Preferred embodiments of the present invention can use various types of waves as an acoustic wave. For example, a surface acoustic wave device, which utilizes a surface acoustic wave, can be provided in accordance with a preferred embodiment of the present invention.

A method for fabricating an acoustic wave device according to a preferred embodiment of the present invention includes the steps of forming an insulating material layer on a piezoelectric substrate, forming a patterned photoresist on the insulating material layer, patterning the insulating material layer, and forming a piezoelectric-substrate exposed depression corresponding to a region in which an IDT electrode is to be formed on a first insulator layer made of the insulating material layer, depositing a metallic material on the piezoelectric substrate to form the IDT electrode in the piezoelectric-substrate exposed depression such that the IDT electrode is thinner than the first insulator layer and coating the photoresist with a metallic film, removing the photoresist and the metallic layer on the photoresist by the lift-off technique, and depositing a second insulator layer so as to cover the IDT electrode and the first insulator layer.

In the acoustic wave device according to the first and second preferred embodiments of the present invention, the surface of the insulator layer in at least one portion of the second surface region, under which no IDT electrode is located, is higher than the surface of the other portion of the insulator layer by at least about $0.001\lambda$. Therefore, the temperature characteristic can be reliably improved due to the surface portion of the insulator layer having a sufficient thickness. In addition, because the surface of the insulator layer in at least one portion of the first surface region is lower, as described above, and the thickness of the insulator layer is reduced, the insertion loss is less prone to being degraded and the fractional bandwidth is less prone to being narrowed.

Accordingly, the temperature characteristic can be improved without causing a narrowing of the fractional bandwidth and an increase in the insertion loss.

With the method for fabricating an acoustic wave device according to preferred embodiments of the present invention, after the completion of the insulating material layer on the piezoelectric substrate, the patterned photoresist is formed on the insulating material layer, the laminated film in which the insulating material layer and the photoresist are laminated is patterned, and the first insulator layer having the piezoelectric-substrate exposed depression in which the IDT electrode is to be formed is formed. Then, the metallic material is deposited so as to be thinner than the first insulator layer, thereby forming the IDT electrode in the piezoelectric-substrate exposed depression. The photoresist and the metallic film on the photoresist are removed by the lift-off technique, and finally, the second insulating material film is formed so as to cover the IDT electrode and the insulating material layer. In this case, the first insulator layer is thicker than the IDT electrode. Therefore, by deposition of the second insulating material layer, the acoustic wave device having a relatively thin insulator layer over the IDT electrode can be easily fabricated.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 6 illustrates a relationship between the thickness of a second insulator layer and the temperature characteristic TCF in a related-art surface acoustic wave device prepared for comparison.

FIG. 7 illustrates a relationship between the thickness of a second insulator layer and the fractional bandwidth BW in the related-art surface acoustic wave device prepared for comparison.

FIG. 10 illustrates a relationship between the height x of a projection of a surface of an insulator layer and the amount of a frequency shift immediately after power is turned on.

DETAILED DESCRIPTION OF PREFERRED EMBODIMENTS

Specific preferred embodiments of the present invention will be described below with reference to the drawings.

Figure 1A:
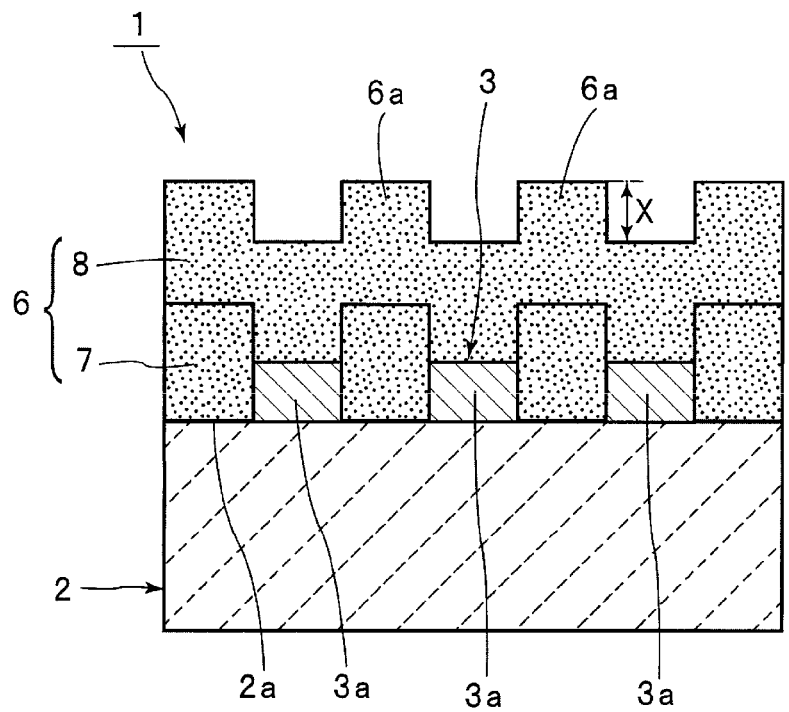
FIG. 1A is a schematic front sectional view that illustrates a main portion of a surface acoustic wave device according to a preferred embodiment of the present invention.
Figure 1B:
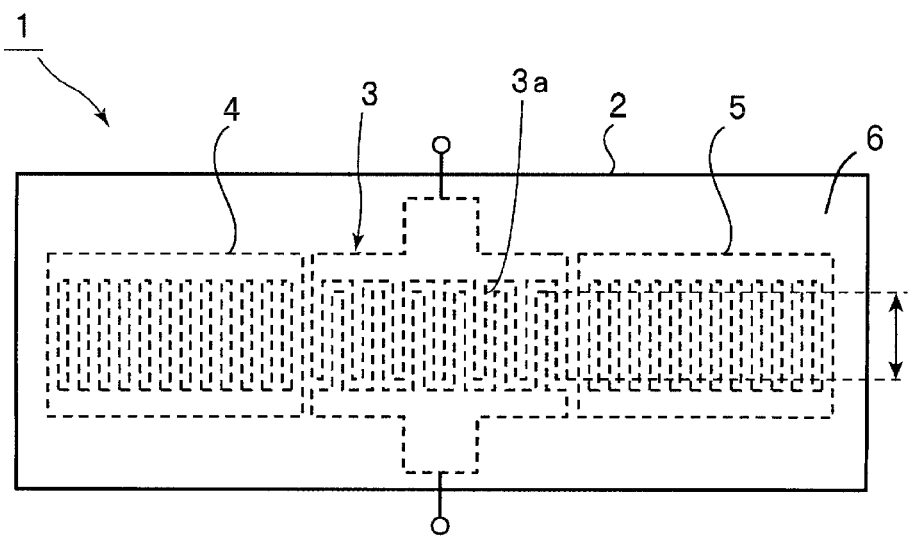
FIG. 1B is a plan view of the surface acoustic wave device.

FIG. 1A is a partial enlarged front sectional view that illustrates an enlarged portion of a region where an IDT electrode is formed in a surface acoustic wave device according to a first preferred embodiment of the present invention, and FIG. 1B is a schematic plan view of the surface acoustic wave device.

A surface acoustic wave device 1 according to the present preferred embodiment is a one-port surface acoustic wave resonator, as illustrated in FIG. 1B. This surface acoustic wave resonator is used as one of a plurality of resonators defining a band-pass filter at a transmission side of a duplexer of a mobile phone.

As illustrated in FIG. 1B, the surface acoustic wave device 1 includes a piezoelectric substrate 2. The piezoelectric substrate 2 preferably is made using, but not limited to, a 128° rotated Y-plate X-propagation $LiNbO_3$ substrate, for example.

An IDT electrode 3 is provided on the piezoelectric substrate 2. The IDT electrode 3 includes a pair of comb-shaped electrodes each having a plurality of electrode fingers 3a. In the direction of propagation of a surface acoustic wave, a reflector 4 is disposed at one side of the IDT electrode 3, and a reflector 5 is disposed at the other side of the IDT electrode 3. Each of the reflectors 4 and 5 has a structure in which a plurality of electrode fingers are shorted at both ends.

In the present preferred embodiment, each of the IDT electrode 3 and the reflectors 4 and 5 is preferably made of an electrode material principally composed of copper. More specifically, each of the IDT electrode 3 and reflectors 4 and 5 has a laminated structure in which a thinner adhesion layer made of titanium is disposed on the piezoelectric substrate 2, a main electrode layer made of copper is provided on the adhesion layer, and a protective electrode layer made of AlCu is laminated on the copper main electrode layer. In the present preferred embodiment, it is preferable that the titanium adhesion layer has a thickness of about 0.01λ, the main electrode layer has a thickness of about 0.04λ, and the protective electrode layer has a thickness of about 0.005λ, for example, where the wavelength of a surface acoustic wave is λ.

Each of the IDT electrode 3 and the reflectors 4 and 5 may also be made of a single metallic layer. Alternatively, each of the IDT electrode and the reflectors 4 and 5 may also have a structure in which a plurality of electrode layers are laminated, as in the present preferred embodiment.

An insulator layer 6 to improve temperature characteristics is preferably arranged so as to cover the IDT electrode 3 and the reflectors 4 and 5. In the present preferred embodiment, the insulator layer 6 includes a first insulator layer 7 and a second insulator layer 8. The first insulator layer 7 is disposed around the IDT electrode 3, i.e., between the electrode fingers and in a region outside the electrode. The second insulator layer 8 is arranged so as to cover the first insulator layer 7 and the IDT electrode 3. The first insulator layer 7 is also formed around the reflectors 4 and 5, i.e., between the electrode fingers of the reflectors and in a region outside the reflectors. The second insulator layer 8 is similarly arranged.

The thickness of the first insulator layer 7 is greater than that of the IDT electrode 3, i.e., that of the electrode. The difference in thickness therebetween is preferably at least about 0.001λ, for example, where the wavelength of a surface acoustic wave is λ.

The second insulator layer 8 is provided by forming an insulator layer having the same film thickness. Therefore, the second insulator layer 8 has a projection and a depression in its upper surface, as illustrated in the drawing. The upper-surface region of the insulator layer 6 is classified into a first surface region under which the IDT is disposed and a second surface region under which no IDT is disposed. Because the first insulator layer 7 is thicker than the IDT electrode 3, the height of the surface of the insulator layer 6 in the second surface region is greater than the height of the surface of the insulator layer 6 from a top surface 2a of the piezoelectric substrate 2 in the first surface region, under which the IDT electrode 3 is disposed, by at least about 0.001λ, for example.

In other words, a projection and a depression are provided in the surface, i.e., the upper surface of the insulator layer 6, as illustrated in the drawing, and an upwardly protruding projection 6a is provided in the second surface region, under which no IDT electrode is disposed. The height of the projection 6a from the surface of the insulator layer formed around the projection 6a is at least about 0.001λ, for example.

Similarly, also in the region in which the reflectors 4 and 5 are disposed, the surface of the insulator layer in the second surface region, around the region at which the electrode is disposed, is higher than the surface of the insulator layer in the first surface region, under which the electrode is disposed, by at least about 0.001λ, for example.

As described above, in the surface acoustic wave device 1 according to the present preferred embodiment, the insulator layer disposed in the second surface region has a sufficient thickness. Therefore, the temperature characteristics can be effectively improved. The insulator layer is thinner over the IDT electrode 3, so the fractional bandwidth is less prone to being narrowed and the insertion loss is less prone to being degraded, as is clear from an experimental example described later.

One example of a method for fabricating the surface acoustic wave device 1 will now be described with reference to FIGS. 2A to 2F.

FIGS. 2A to 2F are partial front sectional views that schematically illustrate a method for fabricating the surface acoustic wave device 1.

Figure 2A:
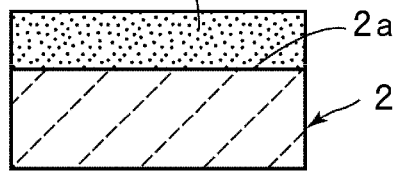
FIGS. 2A to 2F are schematic front sectional views describing the steps of fabricating a surface acoustic wave device according to a preferred embodiment of the present invention.

First, as illustrated in FIG. 2A, the piezoelectric substrate 2 composed of 128° rotated Y-plate X-propagation LiNbO$_3$ is prepared. Then, a SiO$_2$ film 7A is formed on the piezoelectric substrate 2 in order to form the first insulator layer 7 being thicker than the IDT electrode 3 by at least about 0.001λ, for example.

Figure 2B:
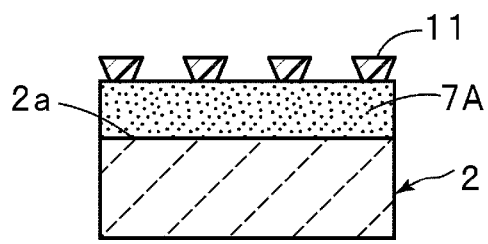

After that, as illustrated in FIG. 2B, a patterned photoresist 11 is formed by photolithography on a region around a region where the IDT electrode is to be formed. The patterned photoresist 11 covers the previously described second surface region.

Figure 2C:
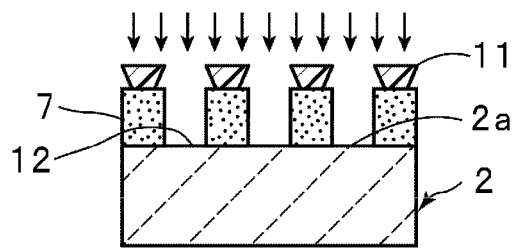

After that, as illustrated in FIG. 2C, the SiO$_2$ film 7A that is not covered with the patterned photoresist 11, i.e., that is formed in the first surface region is removed by reactive ion etching, thus forming a piezoelectric-substrate exposed depression 12. In this manner, the first insulator layer 7 is formed.

Figure 2D:
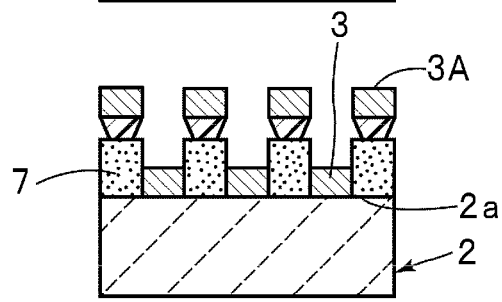

Then, as illustrated in FIG. 2D, in order to form the IDT electrode 3, a metallic film 3A is formed over the entire surface. The metallic film 3A is thinner than the first insulator layer 7. The portion of the metallic film applied on the piezoelectric-substrate exposed depression forms the IDT electrode 3. The metallic film 3A is obtained by sequentially depositing a Ti layer, a Cu layer, and an AlCu layer by a thin-film forming method, such as vapor deposition, as with the case of forming the IDT electrode 3 described above.

Figure 2E:
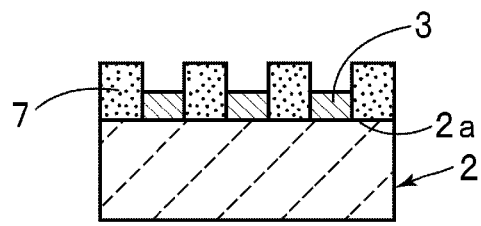

Then, the patterned photoresist 11 is removed by the lift-off technique together with the metallic film 3A formed on the patterned photoresist 11. As illustrated in FIG. 2E, a structure in which the IDT electrode 3 and the first insulator layer 7 are formed on the piezoelectric substrate 2 is obtained.

Figure 2F:
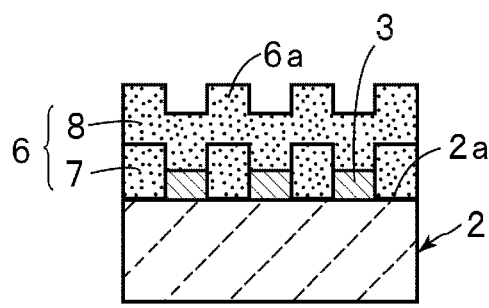

After that, as illustrated in FIG. 2F, the second insulator layer 8 made of SiO$_2$ is formed over the entire surface. Because the first insulator layer 7 is thicker than the IDT electrode 3 by at least about 0.001λ, as described above, the projections and depressions having a substantially uniform shape are formed in the upper portion of the second insulator layer 8 along the width direction of interlocking of the IDT electrode, i.e., in a direction substantially perpendicular to the sectional views of FIGS. 2A to 2F by forming the second insulator layer 8 having the same film thickness by a commonly used thin-film forming method, such as vapor deposition or sputtering.

The fabricating method described above uses photoresist etching. However, the method for fabricating the surface acoustic wave device 1 is not limited to the above-described fabricating method. For example, the surface acoustic wave device 1 may be obtained by partially removing the surface of the insulator layer by, for example, etching, after the IDT electrode 3 and the insulator layer are formed on the piezoelectric substrate 2. In this case, the portion of the insulator layer removed by etching can be a portion over a region where the IDT electrode 3 is disposed. In this case, the first and second insulator layers are integrally made of the same material.

The first insulator layer and the second insulator layer may be made of the same material, as described above. They may be individually formed of the same material, as in the preferred embodiment described above. The first insulator layer and the second insulator layer may also be made of different insulating materials. Forming the first and second insulator layers from the same insulating material reduces kinds of materials and simplifies the fabricating process.

The insulating material of each of the first insulator layer and the second insulator layer is not particularly limited. In addition to silicon dioxide, an oxide or a nitride of silicon, tantalum, aluminum, or other suitable elements, for example SiO$_x$N$_y$, or TaO$_x$ may be used.

The electrode material of the IDT electrode is not particularly limited, so it is not limited to the material used in the above-described preferred embodiment. The IDT electrode is not limited to a laminated film in which a plurality of electrode layers are laminated, and it may also be made of a single metallic material.

Figure 3A:
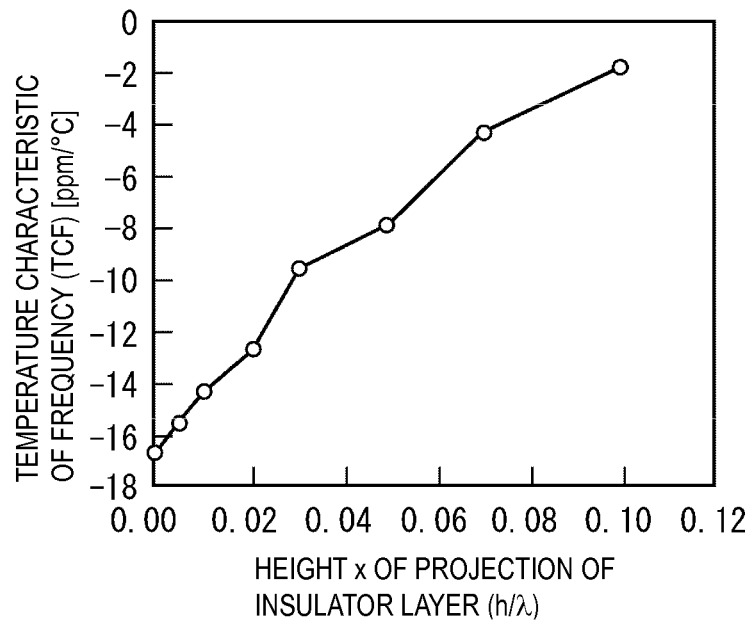
FIG. 3A illustrates a relationship between the height x of a projection of an insulator layer and the temperature characteristic TCF in the surface acoustic wave device according to a preferred embodiment of the present invention.
Figure 3B:
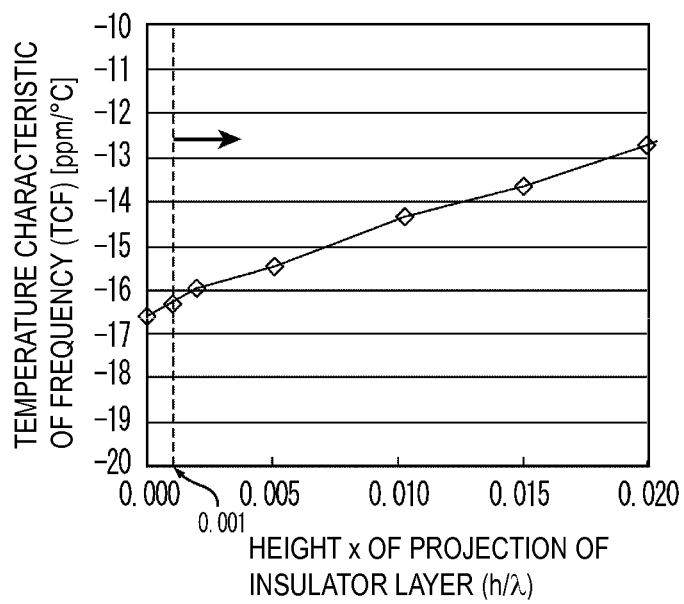
FIG. 3B illustrates an enlarged portion thereof.

In the surface acoustic wave device 1 described above, the height of the insulator layer 6 from the top surface 2a of the piezoelectric substrate 2 in the first surface region was about 0.27λ. The height of the insulator layer 6 in the second surface region was about 0.27λ+xλ. As illustrated in FIGS. 3A and 3B, by variously changing x, i.e., the height of a projection of the insulator layer, this height corresponding to the height of the insulator layer in the second surface region minus the height of the insulator layer in the first surface region a plurality of types of the surface acoustic wave device 1 were fabricated.

The duty of the IDT electrode 3 was about 0.5.

The temperature coefficient of frequency TCF of each of a plurality of types of the surface acoustic wave devices 1 prepared in the above-described manner was measured. TCF was obtained by measuring the changes in resonant frequency due to temperature of the surface acoustic wave device 1 in a temperature range of about −25° C. to about +85° C.

As shown in FIGS. 3A and 3B, it was found that TCF approaches 0 ppm/° C. as the height x of the projection of the insulator layer increases. That is, it was found that changes in frequency characteristics due to temperature are reduced and the temperature characteristics are improved. In particular, it was found that, when x is at least about 0.001λ, the advantageous effects of the improvement in TCF are most evident.

Figure 4A:
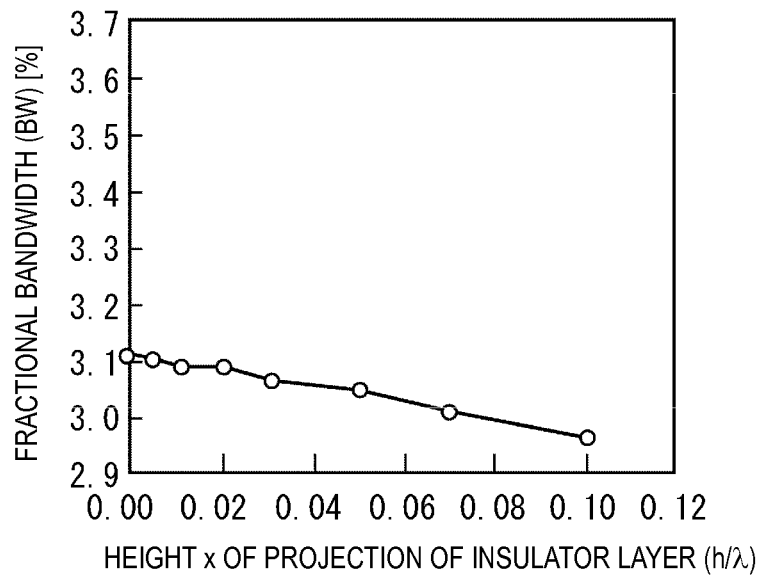
FIG. 4A illustrates a relationship between the height x of a projection of an insulator layer and the fractional bandwidth BW in the surface acoustic wave device according to a preferred embodiment of the present invention.
Figure 4B:
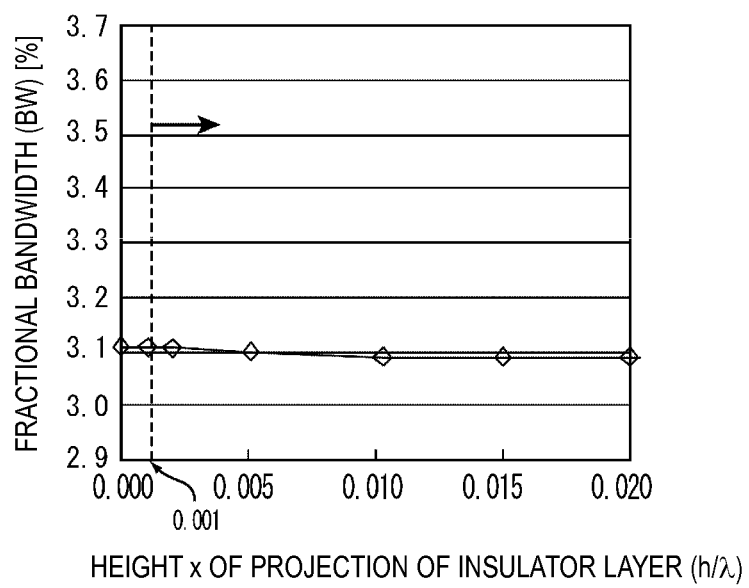
FIG. 4B illustrates an enlarged portion thereof.

Changes in the fractional bandwidth with respect to the height x of the projection of the insulator layer of the surface acoustic wave device 1 are illustrated in FIGS. 4A and 4B.

As shown in FIGS. 4A and 4B, it was found that the fractional bandwidth is reduced with an increase in the height x of the projection of the insulator layer. However, as is clear from the comparison between FIGS. 3 and 4, when the height of the projection of the insulator layer increases, the advantageous effects of improving temperature characteristics are increased, whereas the fractional bandwidth is not significantly reduced.

Figure 5A:
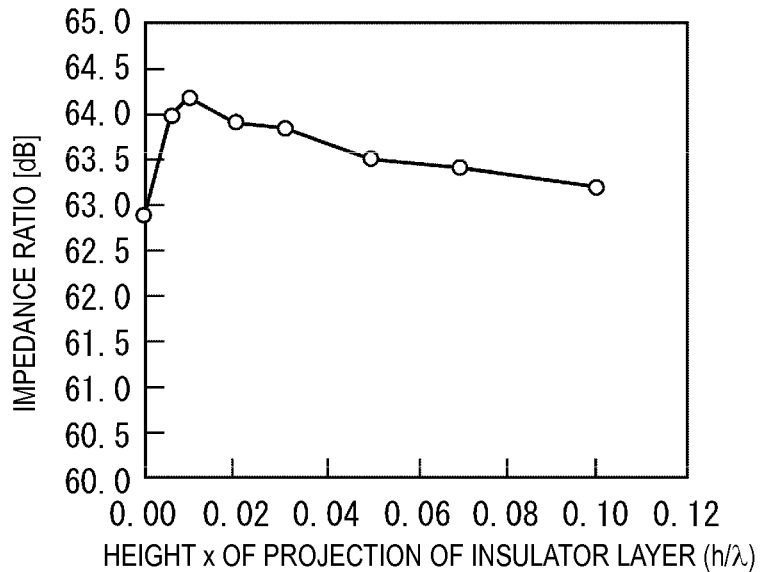
FIG. 5A illustrates a relationship between the height x of a projection of an insulator layer and the impedance ratio in the surface acoustic wave device according to a preferred embodiment of the present invention.
Figure 5B:
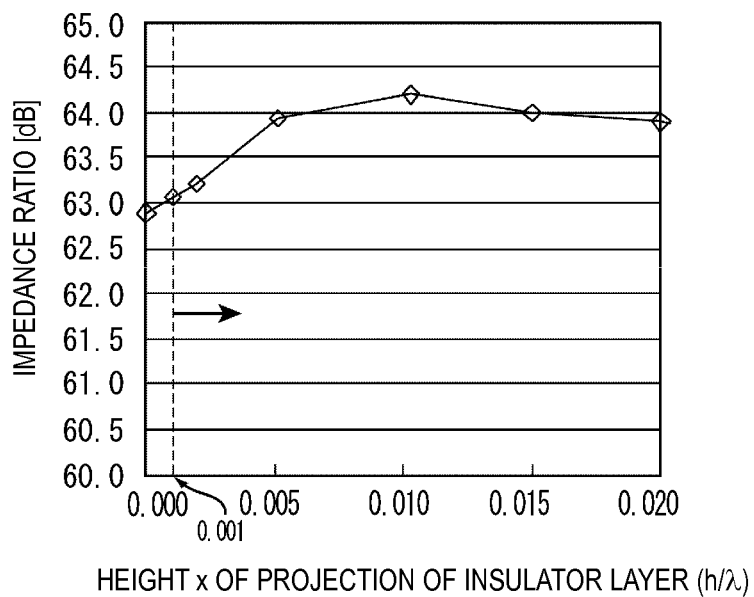
FIG. 5B illustrates an enlarged portion thereof.

FIGS. 5A and 5B illustrate changes in the impedance ratio in the surface acoustic wave device 1 i.e., the ratio of impedance at an antiresonant frequency to impedance at a resonant frequency with respect to the height x of the projection of the insulator layer.

As shown in FIGS. 5A and 5B, when the height x of the projection of the insulator layer changes, the impedance ratio changes. When x is at least about $0.001\lambda$, the impedance ratio is large, as compared to a related-art example in which x is zero, thereby enabling the insertion loss to be effectively reduced.

Figure 14:
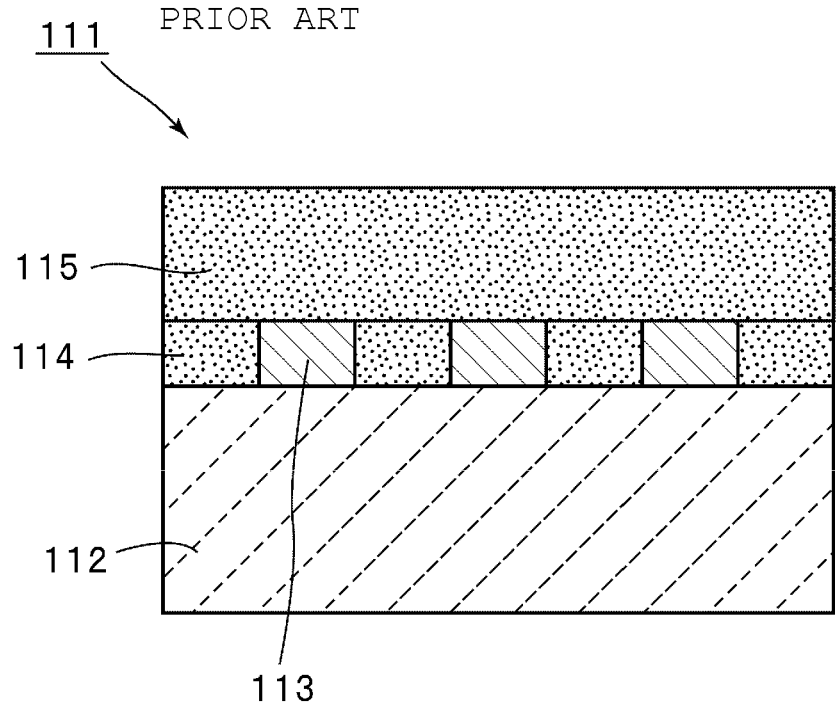
FIG. 14 is a schematic front sectional view that illustrates another example of the related-art surface acoustic wave device.

As described above, compared to when the height of the projection of the insulator layer is zero, i.e., compared to a structure corresponding to the related-art example illustrated in FIG. 14, if the height x of the projection of the insulator layer is at least about $0.001\lambda$, the temperature characteristics can be effectively improved without a significant reduction in the fractional bandwidth and in the impedance ratio.

Accordingly, as is clear from FIGS. 3A to 5B, in the present preferred embodiment, the height x of the projection of the insulator layer preferably is at least about $0.001\lambda$, for example.

For comparison, the surface acoustic wave device illustrated in FIG. 14 was fabricated in a similar manner to that of the above-described preferred embodiment. In the surface acoustic wave device 1 in the comparison example, a $SiO_2$ film for improving temperature characteristics having a film thickness of about $0.27\lambda$, about $0.29\lambda$, about $0.31\lambda$, or about $0.33\lambda$ was formed as the second insulator layer. It is substantially the same as in the above-described preferred embodiment except that the surface of the second insulator layer is flat. The temperature characteristic and the fractional bandwidth in the surface acoustic wave device according to this related-art example were measured in substantially the same manner as in the above-described preferred embodiment. The results are shown in FIGS. 6 and 7.

FIGS. 6 and 7 illustrate changes in the temperature characteristic TCF and in the fractional bandwidth, respectively, with respect to the thickness of the second insulator layer in the surface acoustic wave device according to the related-art example prepared for comparison.

As shown in FIGS. 6 and 7, it was found that, in the surface acoustic wave device corresponding to the related-art example illustrated in FIG. 14, as the thickness of the second insulator layer increases, the temperature characteristic are improved, whereas the fractional bandwidth is shapely narrowed.

In contrast to this, as illustrated in FIGS. 3A to 5B, it was found that, in the surface acoustic wave device 1 according to the present preferred embodiment, as previously described, even when the advantageous effects of improving the temperature characteristics are sufficiently obtained from the thicker insulator layer in the second surface region, under which no IDT electrode is disposed, the fractional bandwidth is less prone to being narrowed, the impedance ratio is less prone to being reduced, and therefore, the insertion loss is less prone to being exacerbated. This is because the fractional bandwidth is less prone to being narrowed and the impedance ratio is less prone to being reduced due to a reduced thickness of the insulator layer over the IDT electrode, whereas the advantageous effects of improvement in the temperature characteristics are sufficiently obtained from an increased thickness of the insulator layer in the second surface region, under which no IDT electrode is disposed.

Figure 8:
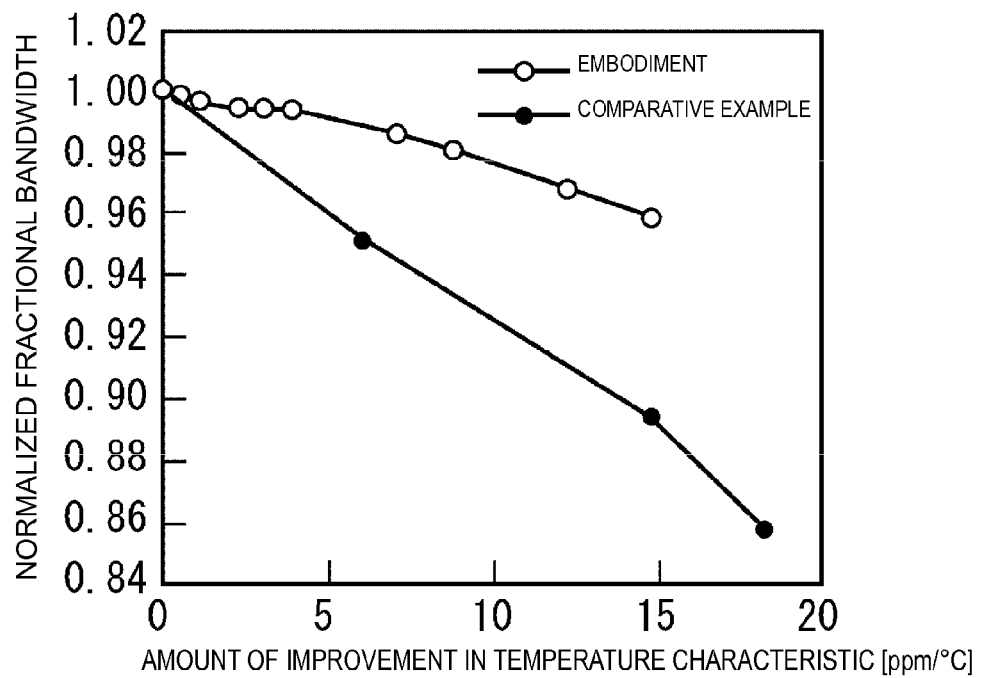
FIG. 8 illustrates a relationship between the amount of improvement in the temperature characteristic and the fractional bandwidth in each of the surface acoustic wave device according to a preferred embodiment of the present invention and that according to a related-art example.

FIG. 8 illustrates a relationship between the amount of improvement in temperature characteristic of frequency and the fractional bandwidth in the surface acoustic wave device 1 according to the above-described preferred embodiment. In FIG. 8, the vertical axis represents a normalized fractional bandwidth relative to a fractional bandwidth in a surface acoustic wave device in which the insulator layer for improving the temperature characteristic is about $0.27\lambda$ and the surface of the insulator layer is substantially flat (x=0).

For comparison, a relationship between the amount of improvement in temperature characteristic of frequency and the fractional bandwidth in the surface acoustic wave device in the related art illustrated in FIG. 14 is also illustrated in FIG. 8.

As shown in FIG. 8, it is found that, in the surface acoustic wave device in the related art illustrated in FIG. 14, when the temperature characteristics are improved, the fractional bandwidth is significantly reduced with an increase in the amount of improvement in temperature characteristic of frequency and, in contrast to this, according to the above-described preferred embodiment, even when the amount of improvement in the temperature characteristic is increased, the fractional bandwidth is less prone to being narrowed.

Figure 13:
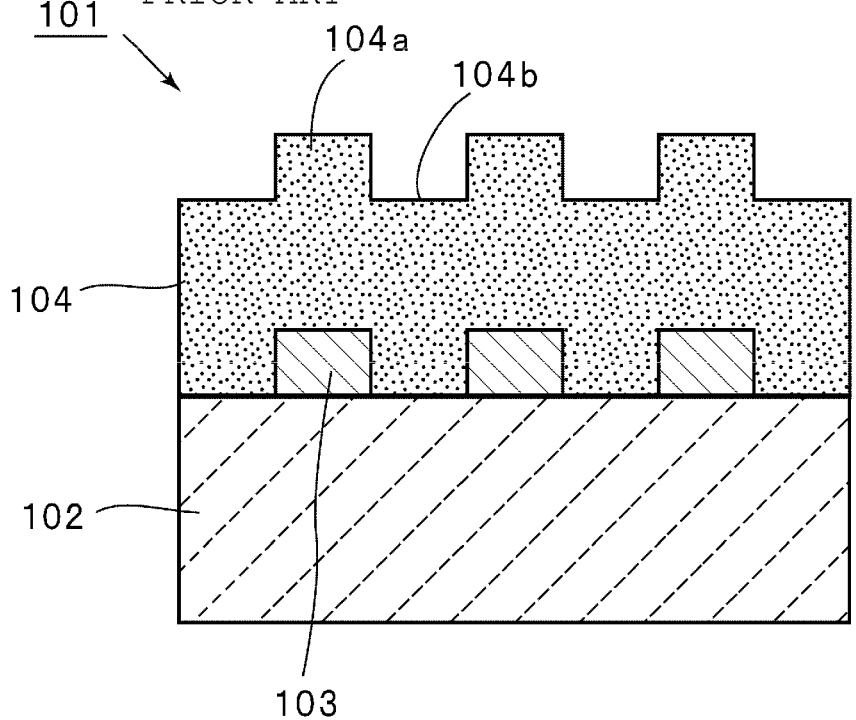
FIG. 13 is a schematic front sectional view that illustrates one example of a related-art surface acoustic wave device.

The surface acoustic wave device illustrated in FIG. 13 in the related art was also fabricated in a similar manner to that of the above-described preferred embodiment except that a $SiO_2$ film having a thickness of about $0.27\lambda$ was formed over the entire surface so as to cover the IDT electrode. The impedance ratio was no more than about 50 dB, which revealed that the characteristics were significantly exacerbated, as compared to the above-described preferred embodiment.

In the above-described preferred embodiment, it is difficult for the fabricating method described with reference to FIG. 2 to form the insulator layer 6 such that the height x of the projection of the insulator layer is at least about $0.3\lambda$ due to process reasons. Accordingly, for manufacturing reasons, the upper limit of the height x of the projection of the insulator layer, i.e., the difference between the height of the surface of the insulator layer in the first surface region and that in the second surface region is about $0.3\lambda$. When the surface acoustic wave device 1 is obtained using a fabricating method other than the above-described fabricating method, the upper limit is not limited to the upper limit value of about $0.3\lambda$, and the height x of the projection of the insulator layer may be about $0.3\lambda$ or more.

In the above-described preferred embodiment, for the projection and depression in the surface of the insulator layer 6, the insulator layer projects in the second surface region, compared to that in the first surface region, and the shape of the IDT electrode 3 in cross section in the cross-sectional direction is substantially rectangular. However, it may be trapezoidal or inverted trapezoidal. The edges formed by the surface of the insulator layer and the projection may be rounded.

Figure 9:
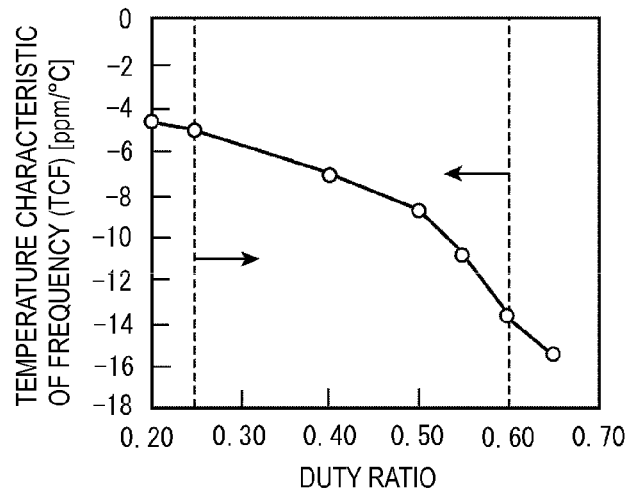
FIG. 9 illustrates a relationship between the duty of an IDT electrode and the temperature characteristic in the surface acoustic wave device according to a preferred embodiment of the present invention.

In the surface acoustic wave device 1, a plurality of types of the surface acoustic wave device 1 having a height x of the projection of the insulator layer of about $0.03\lambda$ and the duty ratio of the IDT electrode having different values were fabricated, and the temperature coefficient of frequency TCF was measured. The results are shown in FIG. 9. As is shown in FIG. 9, it was found that, when the duty ratio is about 0.60 or less, the absolute value of the temperature characteristic TCF can be less than about $-14$ ppm/° C., and the temperature characteristics can be effectively improved. When the duty ratio is less than about 0.25, it is not preferred because the electric resistance is too high. Accordingly, it is preferable that the duty ratio be in a range of about 0.25 to about 0.6, for example.

Figure 10:
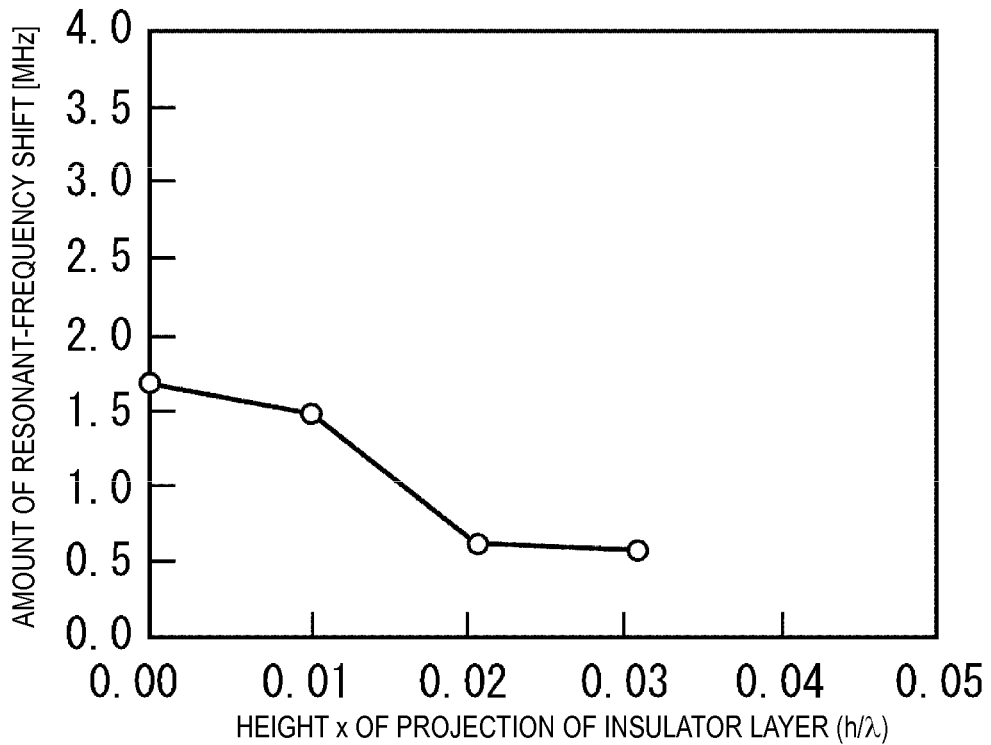

Next, in the surface acoustic wave device 1 according to the above-described preferred embodiment fabricated such that the height x of the projection of the insulator layer was about $0.01\lambda$, about $0.02\lambda$, or about $0.03\lambda$, the behavior of changes in resonant frequency immediately after a power of about 0.9 W was turned on was observed. The results are shown in FIG. 10. For comparison, the surface acoustic wave device having a height x of the projection of the insulator layer being zero, i.e., that corresponds to the related-art example illustrated in FIG. 14 was fabricated in a similar manner, and the amount of the frequency shift immediately after power was turned on was measured. The results are shown in FIG. 10.

As shown in FIG. 10, it was found that, when the height x of the projection of the insulator layer increases, the amount of the frequency shift occurring immediately after power is turned on is reduced. That is, it was found that the withstand electric power is improved, and this can suppress to a greater extent the frequency shift occurring immediately after power is turned on. In particular, when the height x of the projection of the insulator layer is in a range of about 0.01λ to about 0.03λ, the amount of the frequency shift is significantly improved, and it is further improved when the height x of the projection of the insulator layer is in a range of about 0.02λ to about 0.03λ.

Therefore, it was found that, according to preferred embodiments of the present invention, a surface acoustic wave device having stable characteristics immediately after power is turned on is provided.

Figure 11:
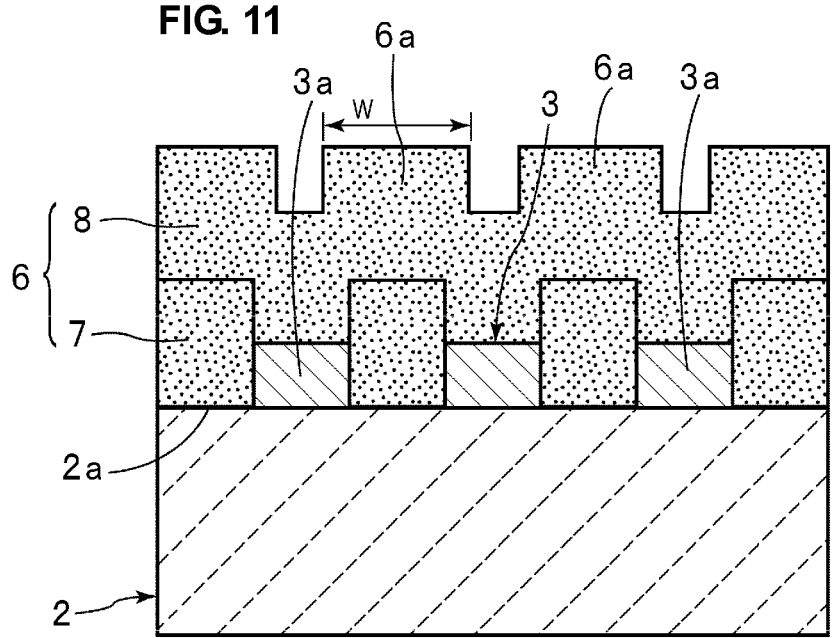
FIG. 11 is a schematic front sectional view for describing the surface acoustic wave device according to one modified example of preferred embodiments of the present invention.

In the surface acoustic wave device 1 illustrated in FIG. 1A, the height of the insulator layer in the entire first surface region, under which the IDT electrode 3 is disposed, is less than the height of the insulator layer in the entire second surface region, under which no IDT electrode 3 is disposed. However, the surface of the insulator layer in at least one portion of the second surface region may be higher than the surface of the insulator layer region in at least one portion of the first surface region by at least about 0.001λ. As a result, as illustrated in FIG. 11, the height of the insulator layer 6 in at least one portion of the first surface region over the IDT electrode 3 may be less than the height of the insulator layer in the second surface region. In other words, the dimension W of the projection 6a disposed in the surface of the insulator layer 6 along the dimensional width direction of electrode fingers may be greater than the gap between the electrode fingers.

Figure 12:
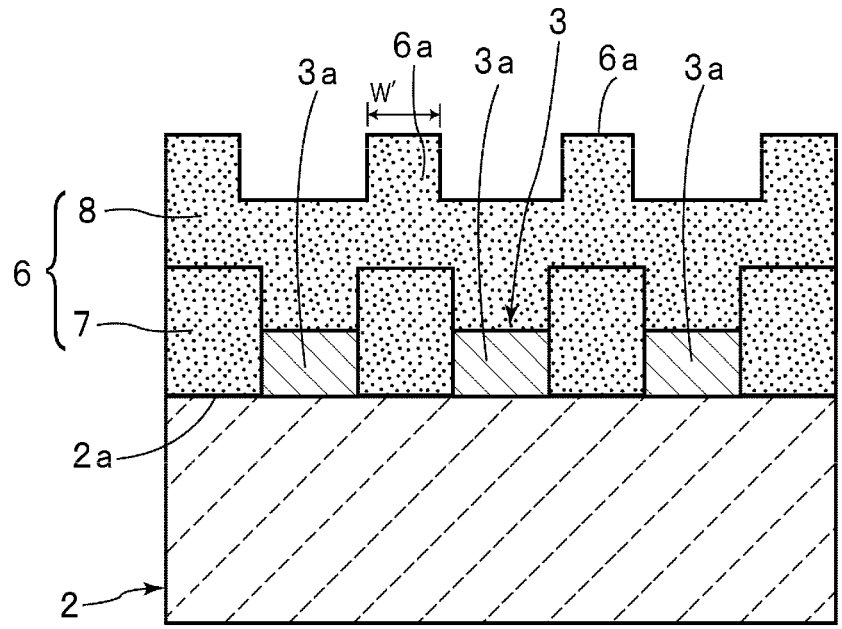
FIG. 12 is a schematic front sectional view for describing the surface acoustic wave device according to another modified example of preferred embodiments of the present invention.

As illustrated in FIG. 12, the surface of the insulator layer in at least one portion of the second surface region, under which no IDT electrode is disposed, may be higher than the surface of the insulator layer in the first surface region. In other words, the width direction dimension W' of the projection 6a disposed in the surface of the insulator layer 6 may be less than the gap between the electrode fingers.

In the above-described preferred embodiment, a one-port surface acoustic wave resonator is described as one example. However, the present invention is applicable to a surface acoustic wave resonator having a different structure and a surface acoustic wave filter device and is also applicable to an acoustic wave device that uses an acoustic wave different from a surface acoustic wave, such as a boundary acoustic wave.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for fabricating an acoustic wave device, the method comprising the steps of:
    forming an insulating material layer on a piezoelectric substrate;
    forming a patterned photoresist on the insulating material layer, patterning the insulating material layer, and forming a piezoelectric-substrate exposed depression corresponding to a region where an interdigital transducer electrode is to be formed on a first insulator layer composed of the insulating material layer;
    depositing a metallic material on the piezoelectric substrate to form the interdigital transducer electrode in the piezoelectric-substrate exposed depression such that the overall interdigital transducer electrode is thinner than the first insulator layer and coating the photoresist with the metallic material;
    removing the photoresist and the metallic material on the photoresist; and
    depositing a second insulator layer so as to cover the interdigital transducer electrode and the first insulator layer; wherein
    the second insulator layer includes an upper surface and a lower surface opposed to the upper surface;
    the upper surface of the second insulator layer includes a first surface region under which the interdigital transducer electrode is located and a second surface region under which the interdigital transducer electrode is not located; and
    the step of depositing the second insulator layer is performed such that a height of at least a portion of the second surface region of the second insulator layer measured from the piezoelectric substrate is greater than a height of at least a portion of the first surface region of the second insulator layer measured from the piezoelectric substrate.

2. The method for fabricating an acoustic wave device according to claim 1, wherein the first and second insulator layers are made of the same insulating material.

3. The method for fabricating an acoustic wave device according to claim 1, wherein the first and second insulator layers are made of different insulating materials.

4. The method for fabricating an acoustic wave device according to claim 1, wherein the piezoelectric substrate is made of a piezoelectric material having a negative temperature coefficient of frequency, and the first and second insulator layers are made of silicon oxide.

5. The method for fabricating an acoustic wave device according to claim 1, wherein the interdigital transducer electrode has a duty ratio of between about 0.25 and about 0.60.

* * * * *